United States Patent
Choi et al.

(10) Patent No.: US 12,058,817 B2
(45) Date of Patent: Aug. 6, 2024

(54) ELECTRONIC DEVICE AND METHOD OF MANUFACTURING THE SAME

(71) Applicant: Samsung Display Co., Ltd., Yongin-si (KR)

(72) Inventors: Hayoung Choi, Hwaseong-si (KR); Sang-Chul Byun, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 257 days.

(21) Appl. No.: 17/827,768

(22) Filed: May 29, 2022

(65) Prior Publication Data

US 2022/0386476 A1    Dec. 1, 2022

(30) Foreign Application Priority Data

May 31, 2021    (KR) .................. 10-2021-0070300

(51) Int. Cl.
| | |
|---|---|
| H05K 1/18 | (2006.01) |
| H05K 3/32 | (2006.01) |
| H05K 3/36 | (2006.01) |
| H01L 23/00 | (2006.01) |

(52) U.S. Cl.
CPC ............. *H05K 3/323* (2013.01); *H05K 3/361* (2013.01); *H01L 24/83* (2013.01)

(58) Field of Classification Search
CPC ......... H05K 3/323; H05K 3/361; H01L 24/83

USPC ..................................... 361/679.01
See application file for complete search history.

(56) References Cited

U.S. PATENT DOCUMENTS

| 8,802,214 B2 | 8/2014 | Liang et al. | |
|---|---|---|---|
| 2017/0062379 A1* | 3/2017 | Zhang | ............ H01L 24/16 |
| 2017/0338198 A1 | 11/2017 | Jang et al. | |
| 2018/0298206 A1 | 10/2018 | Pail et al. | |

FOREIGN PATENT DOCUMENTS

| KR | 10-1776584 | 9/2017 |
|---|---|---|
| KR | 10-2017-0130003 | 11/2017 |

* cited by examiner

*Primary Examiner* — Binh B Tran
(74) *Attorney, Agent, or Firm* — CANTOR COLBURN LLP

(57) ABSTRACT

An electronic device includes a display panel having first pads, a circuit board that includes second pads corresponding to the first pads, and a conductive adhesive member disposed between the display panel and the circuit board to connect the first pads and the second pads, in which the conductive adhesive member includes a first resin layer adjacent to the display panel, a second resin layer disposed between the first resin layer and the circuit board and having a curing agent different from that of the first resin layer, and conductive particles disposed in the first resin layer wherein at least one of the second pads protrudes through the second resin layer and is in contact with the conductive particles.

20 Claims, 16 Drawing Sheets

ELECTRONIC DEVICE AND METHOD OF MANUFACTURING THE SAME

CROSS-REFERENCE TO RELATED APPLICATIONS

This application claims priority from and the benefit of Korean Patent Application No. 10-2021-0070300, filed on May 31, 2021, which is hereby incorporated by reference for all purposes as if fully set forth herein.

BACKGROUND

Field

Embodiments of the invention relate generally to an electronic device and, more specifically, to an electronic device including electrically connected electronic components.

Discussion of the Background

Various electronic devices used in multimedia devices such as a television, a mobile phone, a tablet computer, a navigation system, and a game console are being developed. These electronic devices include a plurality of electronic components. The plurality of electronic components may include a display panel, a driving chip, a circuit board, and the like. These electronic components are electrically connected through various methods.

The above information disclosed in this Background section is only for understanding of the background of the inventive concepts, and, therefore, it may contain information that does not constitute prior art.

SUMMARY

Devices constructed and methods performed according to illustrative implementations of the invention are capable of having improved electrical characteristics due to the preventing of a short-circuit from occurring between two or more board pads or two or more second pads that receive different signals.

The present disclosure provides an electronic device with improved electrical bonding reliability and an electronic device manufacturing method that provides for improved bonding reliability.

Additional features of the inventive concepts will be set forth in the description that follows, and in part will be apparent from the description, or may be learned by practice of the inventive concepts.

An embodiment provides an electronic device including a display panel including first pads; a circuit board including second pads corresponding to the first pads; and a conductive adhesive member disposed between the display panel and the circuit board to connect the first pads and the second pads, the conductive adhesive member including a first resin layer adjacent to the display panel, a second resin layer disposed between the first resin layer and the circuit board and having a curing agent different from that of the first resin layer, and conductive particles disposed in the first resin layer wherein at least one of the second pads protrudes through the second resin layer and is in contact with the conductive particles.

In an embodiment, the first resin layer may include a photocuring agent and the second resin layer may include a thermosetting agent.

In an embodiment, the minimum diameter of the conductive particles may be greater than the thickness of the first resin layer.

In an embodiment, at least a portion of the conductive particles may be disposed inside the first pads.

In an embodiment, at least another portion of the conductive particles may be disposed inside the second pads.

In an embodiment, any one of conductive particles that do not overlap the first pads, among the conductive particles, may protrude from a surface of the first resin layer adjacent to the display panel.

In an embodiment, a gap of an empty space may be formed between the first resin layer and the display panel, and at least a portion of side surfaces of the first pads may be exposed from the first resin layer.

In an embodiment, the maximum thickness of the second resin layer may be smaller than the thickness of the second pads.

In an embodiment, the display panel may include pixels and a driving chip, the first pads may include first sub pads arranged in a first direction, and second sub pads spaced apart from the first sub pads, the driving chip may be connected to the first sub pads, and the circuit board may be connected to the second sub pads.

In an embodiment, the first sub pads may include a plurality of first row pads arranged in the first direction; and second row pads spaced apart from the first row pads in a second direction intersecting the first direction, and arranged along the first direction.

In an embodiment, the first resin layer may be in contact with the display panel.

In an embodiment, an electronic device includes: a display panel having first pads; a circuit board including second pads corresponding to the first pads; and a conductive adhesive member disposed between the display panel and the circuit board to connect the first pads and the second pads, the conductive adhesive member including a first resin layer having a photocuring agent, a second resin layer disposed between the first resin layer and the circuit board and including a thermosetting agent, and conductive particles disposed in the first resin layer wherein the minimum diameter of the conductive particles is greater than the thickness of the first resin layer.

In an embodiment, at least one of the second pads may protrude through the second resin layer and is in contact with the conductive particles.

In an embodiment, the maximum thickness of the second resin layer may be smaller than the thickness of the second pads.

In an embodiment, at least a portion of the conductive particles may be disposed inside the first pads.

In an embodiment, any one of conductive particles that do not overlap the first pads, among the conductive particles, may protrude from a surface of the first resin layer adjacent to the display panel.

In an embodiment, a gap of an empty space may be formed between the first resin layer and the display panel, and at least a portion of side surfaces of the first pads may be exposed from the first resin layer.

In an embodiment, a method of manufacturing an electronic device includes: providing a preliminary conductive adhesive member including a cover film, a first resin layer, conductive particles disposed in the first resin layer, and a second resin layer disposed between the cover film and the first resin layer; performing first curing on the first resin layer; providing the preliminary conductive adhesive member on pads included in a display panel; removing the cover film from the preliminary conductive adhesive member; aligning pads included in a circuit board with the pads of the display panel; and performing second curing on the second resin layer by pressing the circuit board through a heating bar.

In an embodiment, the first resin layer may include a photocuring agent and the second resin layer may include a thermosetting agent.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1A:
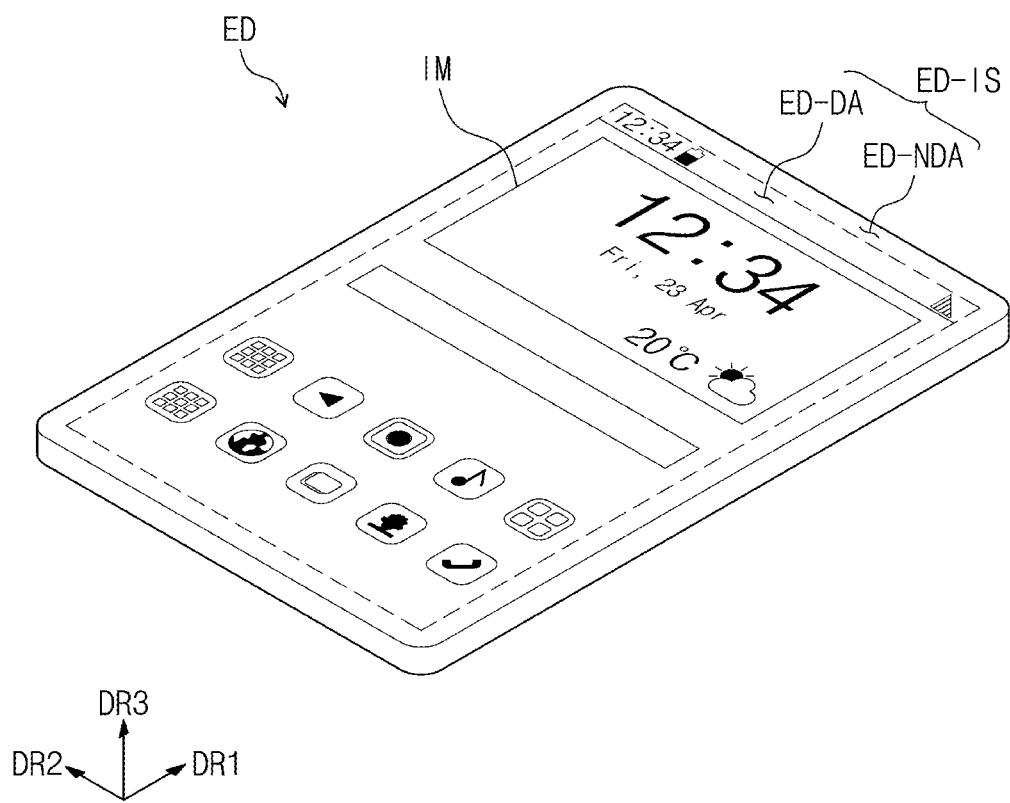
FIG. 1A is a perspective view of an electronic device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z—axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the inventive concepts will be described with reference to the drawings.

Figure 1B:
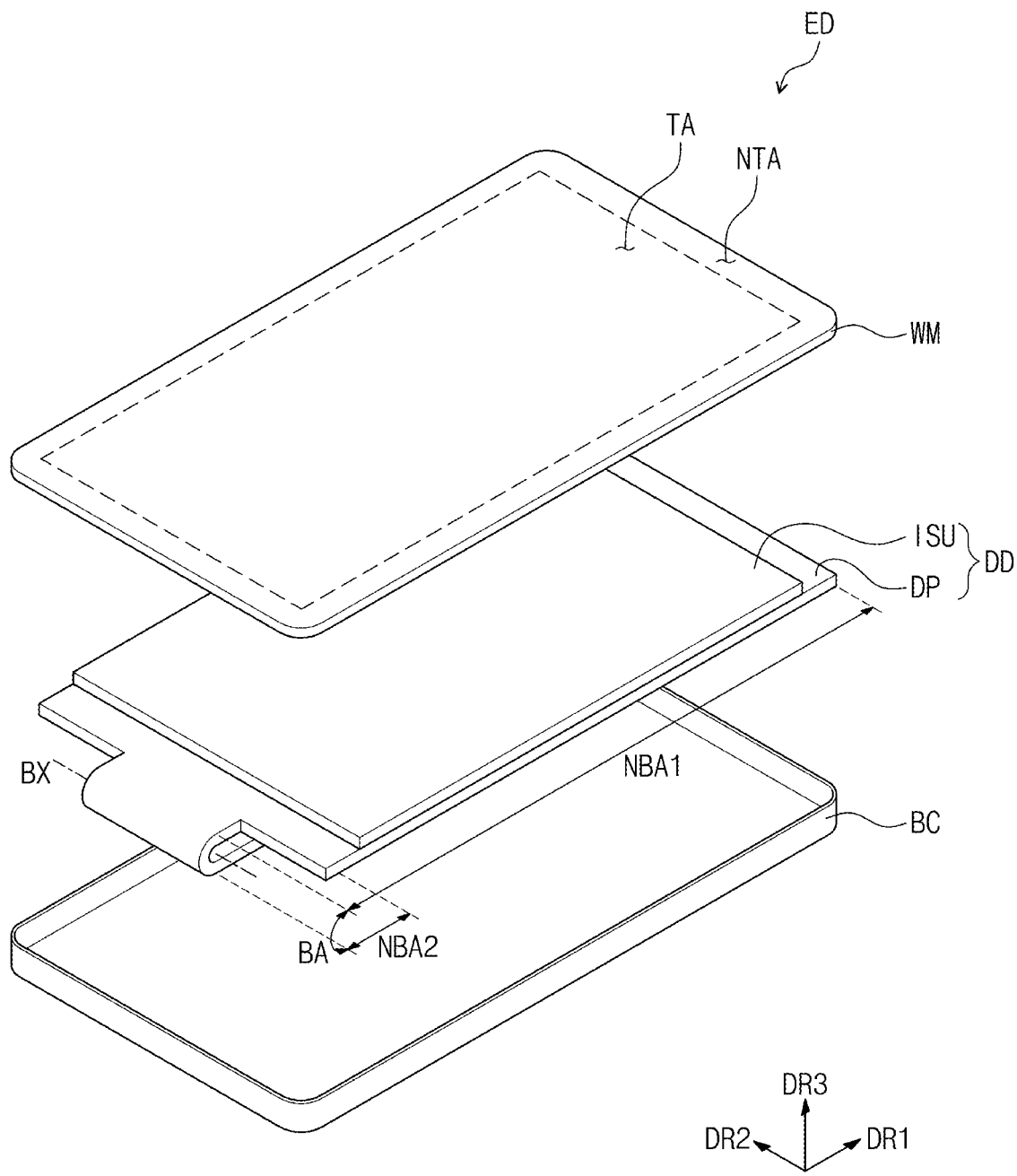
FIG. 1B is an exploded perspective view of an electronic device according to an embodiment.
Figure 1C:
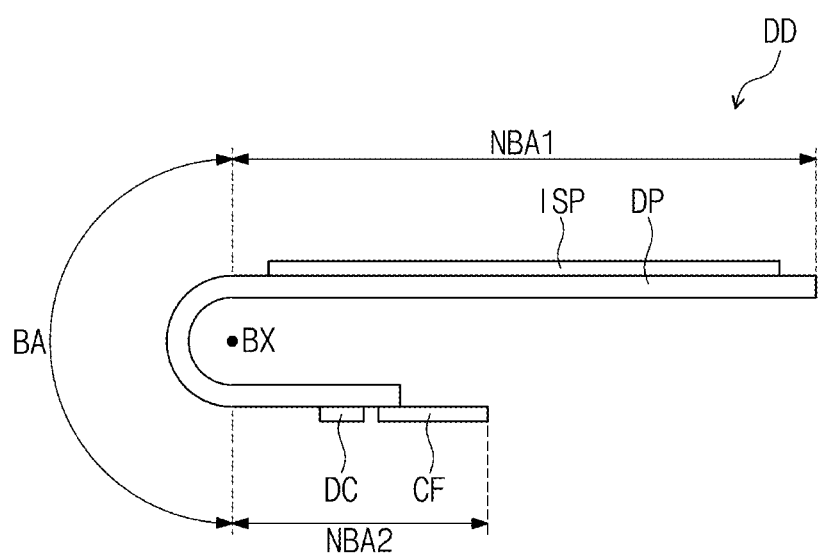
FIG. 1C is a cross-sectional view of a circuit board connected to a display device according to an embodiment.
Figure 1C:
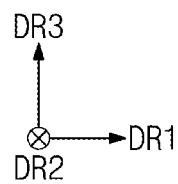
Figure 2:
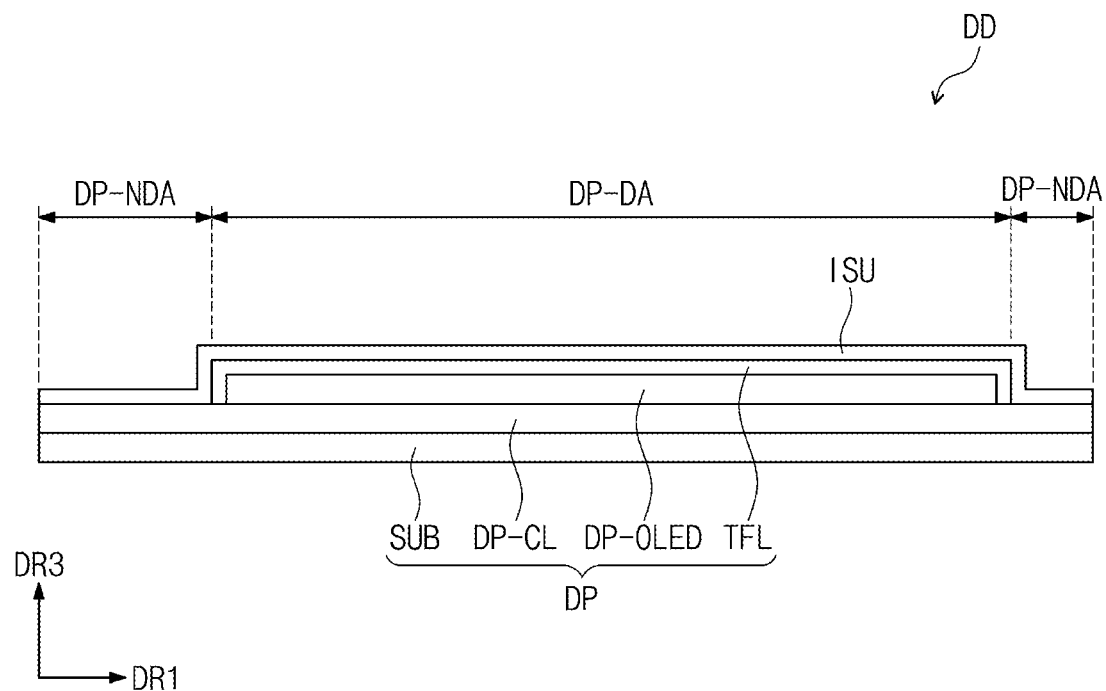
FIG. 2 is a cross-sectional view of a display device according to an embodiment.

FIG. 1A is a perspective view of an electronic device according to an embodiment. FIG. 1B is an exploded perspective view of an electronic device according to an embodiment. FIG. 2 is a cross-sectional view of a display device according to an embodiment. FIG. 1C is a cross-sectional view of a circuit board connected to the display device according to an embodiment.

FIG. 1A is a perspective view of an electronic device ED according to an embodiment. FIG. 1B is an exploded perspective view of an electronic device ED according to an embodiment.

In this specification, a mobile phone terminal is illustrated as the electronic device ED. The electronic device ED according to an embodiment may be applied to large electronic devices such as televisions and monitors, as well as small- and medium-sized electronic devices such as a tablet computer, a car navigation system, a game machine, and a smart watch.

Referring to FIG. 1A, the electronic device ED may display an image IM through a display surface ED-IS. Icon images are illustrated as an example of the image IM. The display surface ED-IS is parallel to a plane defined by a first direction DR1 and a second direction DR2. The normal direction of the display surface ED-IS that is the thickness direction of the electronic device ED is indicated by a third direction DR3.

The display surface ED-IS includes a display region ED-DA on which an image IM is displayed and a non-display region ED-NDA adjacent to the display region ED-DA. The non-display region ED-NDA is a region where an image is not displayed. However, an embodiment as described herein is not limited thereto, and the non-display region ED-NDA may be adjacent to one side of the display region ED-DA or may be omitted in other possible implementations.

In this specification, the wording "when viewed on a plane" or "on a plane" may denote a case of being seen in the third direction DR3. The front surface (or upper surface) and the rear surface (or lower surface) of each of layers or units to be described below are defined based on the third direction DR3. However, the combination of the first to third directions DR1, DR2, and DR3 may be changed to another combination.

Referring to FIG. 1B, the electronic device ED may include a window WM, a display device DD, and an accommodation member BC. The electronic device ED may further include an optical member disposed between the window WM and the display device DD. The optical member may include a polarizer.

The window WM is disposed on the display device DD and may transmit an image provided from the display device DD to the outside. The window WM includes a transmission region TA and a non-transmission region NTA. The transmission region TA may overlap the display region ED-DA and may have a shape corresponding to the display region ED-DA. The window WM may include a base layer and functional layers disposed on the base layer. The functional layers may include a protective layer, an anti-fingerprint layer, and the like. The base layer of the window WM may be made of glass, sapphire, or plastic.

The non-transmission region NTA may overlap the non-display region ED-NDA and may have a shape corresponding to the non-display region ED-NDA. The non-transmission region NTA may be a region having relatively low light transmittance compared to the transmission region TA. The non-transmission region NTA may be defined by disposing a bezel pattern on a portion of the base layer of the window WM, and a region in which the bezel pattern is not disposed may be defined as the transmission region TA. However, the embodiments described herein are not limited thereto, and the non-transmission region NTA may be omitted in some possible implementations.

According to an embodiment, the display panel DP may be any one of a liquid crystal display panel, an electrophoretic display panel, a microelectromechanical system display panel (MEMS), an electrowetting display panel, an organic light emitting display panel, an inorganic light emitting display panel, or a quantum dot light emitting display panel, and is not particularly limited. Hereinafter, the display panel DP will be described as an organic light-emitting display panel.

An input sensor ISU may include any one of a capacitive sensor, an optical sensor, an ultrasonic sensor, or an electromagnetic induction sensor. The input sensor ISU may be formed on the display panel DP through a continuous process, or may be separately manufactured and then attached to the upper side of the display panel DP through an adhesive layer, but is not limited to any embodiment.

The display device DD may further include a driving chip DC and a circuit board CF. An embodiment in which the driving chip DC is mounted on the display panel DP is illustrated, but embodiments described herein are not limited thereto. The driving chip DC may generate a driving signal necessary for the operation of the display panel DP on the basis of a control signal transmitted from the circuit board CF.

The circuit board CF electrically bonded to display panel DP may be bent and disposed on the rear surface of the display panel DP. The accommodation member BC may accommodate the display device DD and may be coupled to the window WM. The circuit board CF may be disposed on one end of a base substrate SUB and electrically connected to a circuit element layer DP-CL. The electronic device ED may further include a main board, electronic modules mounted on the main board, a camera module, a power module, and the like.

Referring to FIG. 1C, the display panel DP according to an embodiment may include a bending region BA, and a first non-bending region NBA1 and a second non-bending region NBA2 that are arranged to be spaced apart from each other in the first direction DR1 with the bending region BA interposed therebetween.

The bending region BA may be defined as a region in which the display panel DP is bent along the virtual bending axis BX extending in the second direction DR2. The first non-bending region NBA1 may be defined as a region overlapping the transmission region TA, and the second non-bending region NBA2 may be defined as a region to which the circuit board CF is connected.

When the bending region BA is bent with respect to the bending axis BX, the circuit board CF and the driving circuit DC may be bent toward the rear surface of the display panel DP and disposed on the rear surface of the display panel DP.

Additional components for compensating for a step difference between the rear surface of the display panel DP and the circuit board CF formed by the bending region BA may be disposed.

According to an embodiment, the width of the first non-bending region NBA1 in the second direction DR2 may be greater width than the widths of the bending region BA and the second non-bending region NBA2. However, embodiments described herein are not limited thereto, and the width of the bending region BA in the second direction may be provided in a shape that becomes narrower from the first non-bending region NBA1 to the second non-bending region NBA2, but embodiments described herein are not limited thereto.

In the above, an example of the electronic device ED has been described as a mobile phone terminal, but in this specification, it is sufficient as long as the electronic device ED includes two or more electrically bonded electronic components. The display panel DP and the driving chip DC mounted on the display panel DP respectively correspond to different electronic components, and the electronic device ED may be configured with only these components. However, embodiments described herein are not limited thereto. For example, the electronic device ED may be configured with only the display panel DP and the circuit board CF connected to the display panel DP, and the electronic device ED may be configured with only the main board and the electronic module mounted on the main board. Hereinafter, the description of the electronic device ED according to an embodiment described hereinbelow will be focused on the bonding structure of the display panel DP and the driving chip DC mounted on the display panel DP.

Figure 3:
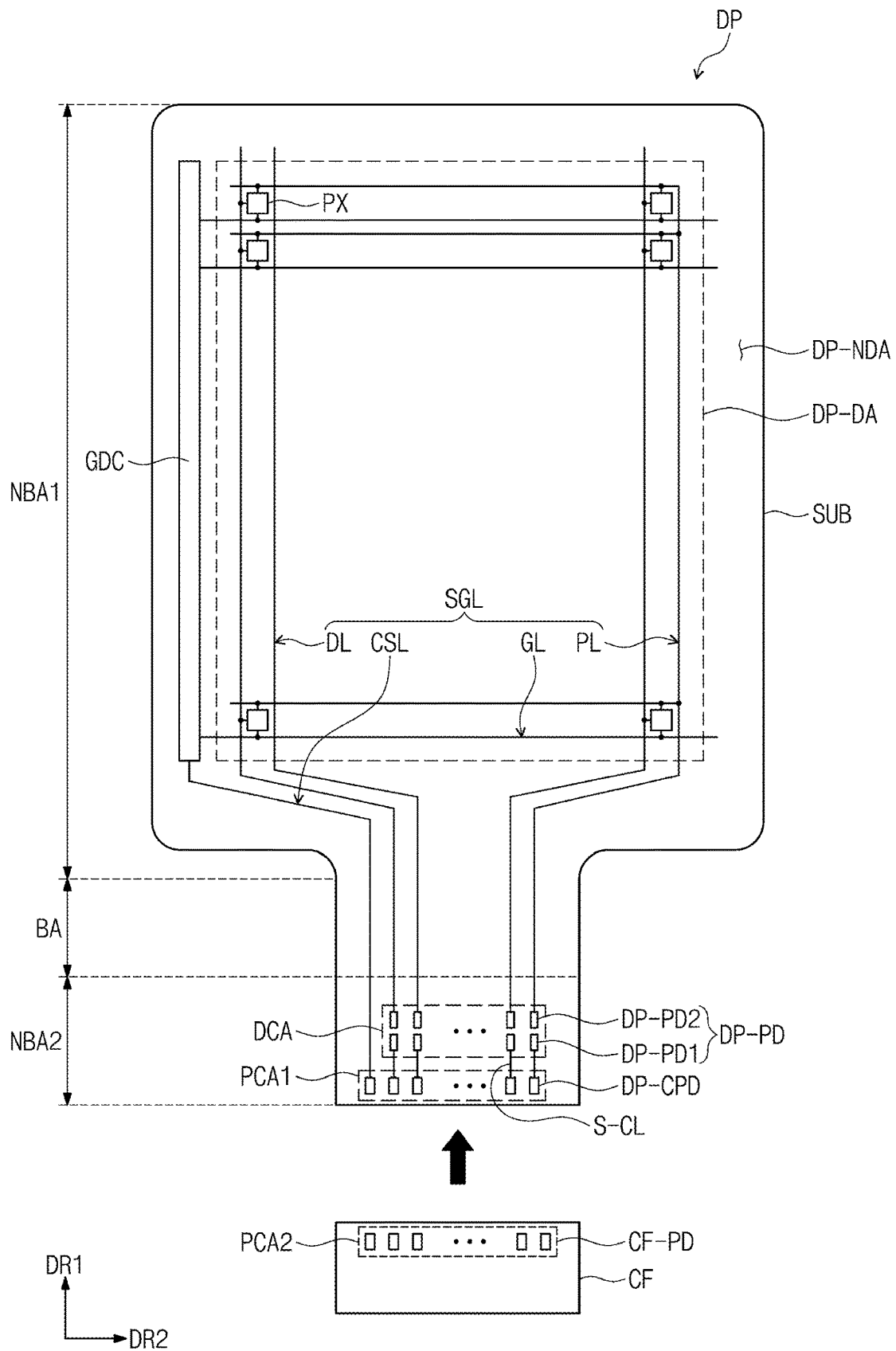
FIG. 3 is a plan view of the display panel according to an embodiment.
Figure 4:
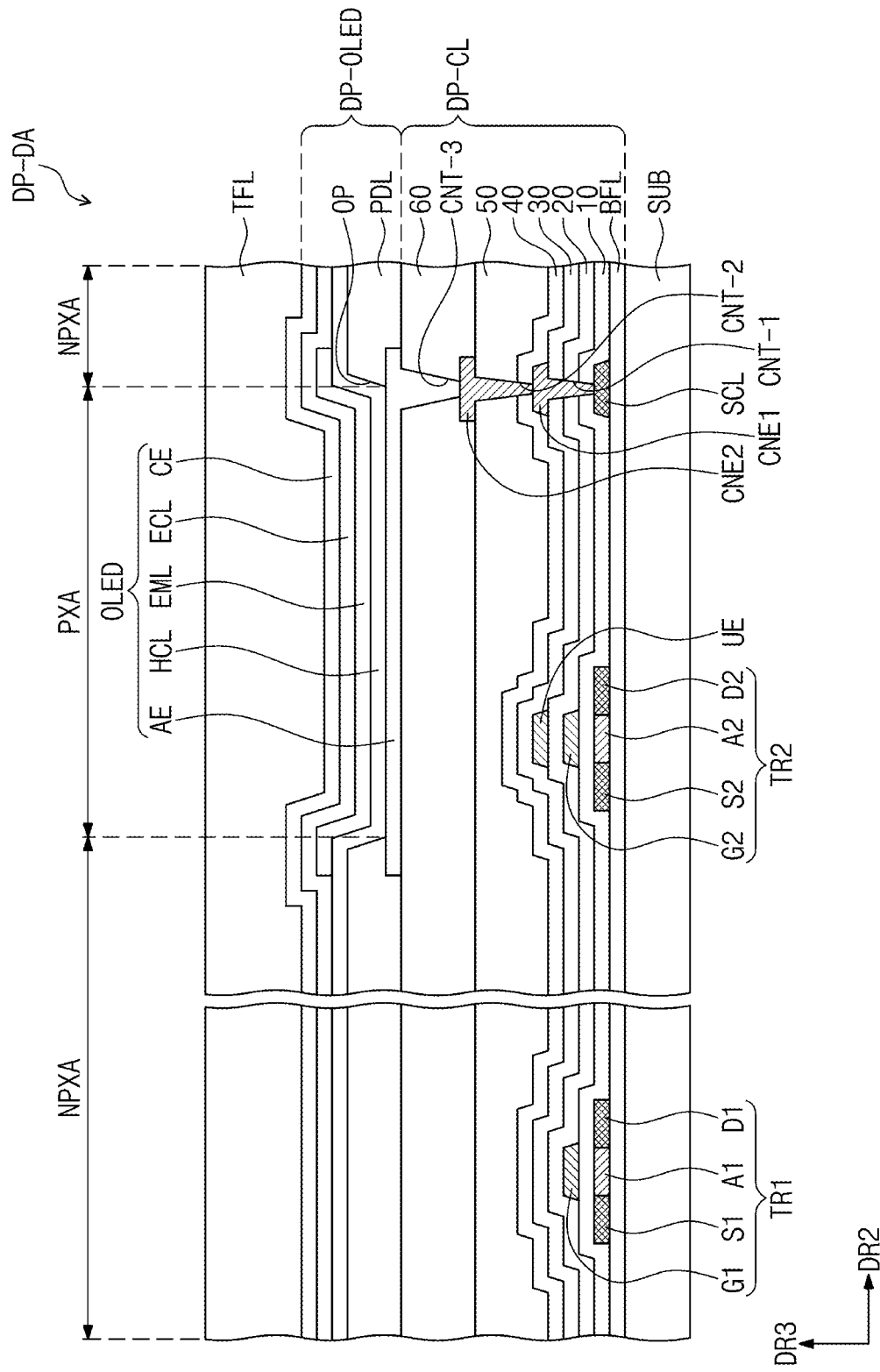
FIG. 4 is a cross-sectional view of a display panel according to an embodiment.
Figure 5:
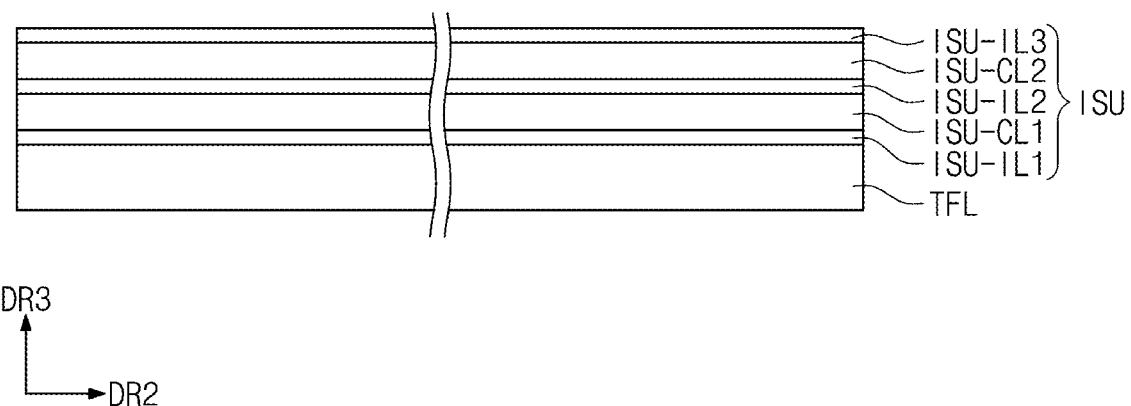
FIG. 5 is a cross-sectional view of an input sensor according to an embodiment.

FIG. 2 is a cross-sectional view of a display device DD according to an embodiment. FIG. 3 is a plan view of a display panel DP according to an embodiment. FIG. 4 is a cross-sectional view of a display panel DP according to an embodiment. FIG. 5 is a cross-sectional view of an input sensor ISU according to an embodiment. In FIG. 2, regions corresponding to the bending region BA and the second non-bending region NBA2 of the display panel DP described in FIG. 1C are omitted for ease in explanation of these embodiments.

Referring to FIG. 2, the display panel DP includes a base substrate SUB, a circuit element layer DP-CL disposed on the base substrate SUB, a display element layer DP-OLED, and an upper insulating layer TFL. The input sensor ISU may be disposed on the upper insulating layer TFL.

The display panel DP includes a display region DP-DA and a non-display region DP-NDA. The display region DP-DA of the display panel DP corresponds to the display region ED-DA illustrated in FIG. 1A or the transparent region TA illustrated in FIG. 1B, and the non-display region DP-NDA corresponds to the non-display region ED-NDA illustrated in FIG. 1A or the non-transmission region NTA illustrated in FIG. 1B.

The base substrate SUB may include at least one plastic film. The base substrate SUB is a flexible substrate and may include a plastic substrate, a glass substrate, a metal substrate, or an organic/inorganic composite material substrate.

The circuit element layer DP-CL includes at least one intermediate insulating layer and a circuit element. The intermediate insulating layer includes at least one intermediate inorganic layer and at least one intermediate organic layer. The circuit element includes signal lines, a driving circuit of a pixel, and the like.

The display element layer DP-OLED includes a plurality of organic light emitting diodes. The display element layer DP-OLED may further include an organic layer such as a pixel defining layer. The upper insulating layer TFL seals the display element layer DP-OLED. For example, the upper insulating layer TFL may include a thin film encapsulation layer. The thin film encapsulation layer may include a stacked structure of an inorganic layer/organic layer/inorganic layer. The upper insulating layer TFL protects the display element layer DP-OLED from foreign substances such as moisture, oxygen, and dust particles. However, embodiments described herein are not limited thereto, and the upper insulating layer TFL may further include an additional insulating layer other than the thin film encapsulation layer. For example, the upper insulating layer TFL may further include an optical insulating layer for controlling the refractive index.

In an embodiment, an encapsulation substrate may be provided in place of the upper insulating layer TFL. In this case, the encapsulation substrate may face the base substrate SUB and may be coupled to the base substrate SUB through a separate adhesive member. A circuit element layer DP-CL and a display element layer DP-OLED may be disposed between the encapsulation substrate and the base substrate SUB.

The input sensor ISU may be directly disposed on the display panel DP. In this specification, "component A is disposed directly on component B" connotes that the adhesive layer is not disposed between component A and component B. In this embodiment, the input sensor ISU and the display panel DP may be manufactured through a continuous process. However, the embodiments described herein are not limited thereto, and the input sensor ISU may be provided as an individual panel and may be coupled to the display panel DP through an adhesive layer. As another example, the input sensor ISU may be omitted in some implementations of the embodiments.

Referring to FIG. 3, the display panel DP may include a plurality of pixels PX, a gate driving circuit GDC, a plurality of signal lines SGL, and a plurality of pads DP-PD and DP-CPD.

The pixels PX are disposed in the display region DP-DA. Each of the pixels PX includes an organic light emitting diode and a pixel driving circuit connected thereto. The gate driving circuit GDC and the signal lines SGL may be included in the circuit element layer DP-CL illustrated in FIG. 2.

The gate driving circuit GDC sequentially outputs gate signals to a plurality of gate lines GL. The gate driving circuit GDC may include a plurality of thin film transistors formed through the same process as the driving circuits of the pixels PX, for example, through a low temperature polycrystalline silicon (LTPS) process or a low temperature polycrystalline oxide (LTPO) process. The display panel DP may further include another driving circuit that provides a light emission control signal to the pixels PX.

The signal lines SGL include gate lines GL, data lines DL, a power line PL, and a control signal line CSL. The gate lines GL are respectively connected to corresponding pixels PX among the pixels PX, and the data lines DL are respectively connected to corresponding pixels PX among the pixels PX. The power line PL is connected to the pixels PX. The control signal line CSL may provide control signals to the scan driving circuit.

The signal lines SGL overlap the display region DP-DA and the non-display region DP-NDA. Each of the signal lines SGL may include a pad part and a line part. The line part overlaps the display region DP-DA and the non-display region DP-NDA. The pad part is connected to the end of the line part. The pad part may overlap a pad region to be described later.

The display panel DP may include display pads (for example, first pads in the claims). The display pads may include first pads (DP-PD, for example, first sub-pads in the claims) and second pads (DP-CPD, for example, second sub-pads in the claims). The first pads DP-PD and the second pads DP-CPD according to an embodiment may be disposed on the second non-bending region NBA2.

Hereinafter, in the embodiments described herein, a region of the non-display regions DP-NDA in which the first pads DP-PD are disposed may be defined as a chip region DCA, and a region of the non-display regions DP-NDA in which the second pads DP-CPD are disposed may be defined as a first pad region PCA1.

The first pads DP-PD may be disposed in the chip region DCA. A driving chip DC (see FIG. 1B) may be mounted on the chip region DCA. The first pads DP-PD are electrically connected to the driving chip DC to transmit, to the signal lines SGL, electrical signals received from the driving chip DC.

The first pads DP-PD includes first row pads DP-PD1 arranged in the second direction DR2, and second row pads DP-PD2 spaced apart from the first row pads DP-PD1 in the first direction DR1 and arranged in the second direction DR2. However, embodiments described herein are not limited thereto, and the first pads DP-PD may be arranged in one row or in a plurality of rows along the second direction DR2.

The second pads DP-CPD may be disposed in the first pad region PCA1. The second pads DP-CPD may be arranged along the first direction DR1. The first pads DP-PD and the second pads DP-CPD may be connected through bridge signal lines S-CL.

Like the first pads DP-PD, the second pads DP-CPD may also include row pads arranged along the first direction DR1. Pads in the one row may include the second pads DP-CPD arranged to be spaced apart from each other in the second direction DR2. The second pads DP-CPD arranged in different row pads may be arranged to overlap or be spaced apart from each other when viewed in the first direction DR1, and embodiments described herein are not limited thereto.

The circuit board CF may include board pads CF-PD (second pads in the claims) electrically connected to the display panel DP. The board pads CF-PD may be disposed in a second pad region PCA2 defined on the circuit board CF. The board pads CF-PD may be arranged along the second direction DR2.

In addition, when the second pads DP-CPD are provided in the form of row pads arranged in the first direction DR1, the board pads CF-PD included in the circuit board CF may also have an arrangement to one-to-one correspond to the second pads DP-CPD, and is not limited to any one embodiment.

The second pad region PCA2 of the circuit board CF may be disposed on the first pad region PCA1. The second pads DP-CPD are electrically connected to the board pads CF-PD included in circuit board CF to transmit, to the first pads DP-PD, an electrical signal received from the circuit board CF. The circuit board CF may be rigid or flexible. For example, when the circuit board CF is flexible, the circuit board CF may be provided as a flexible printed circuit board.

The circuit board CF may include a timing control circuit for controlling the operation of the display panel DP. The timing control circuit may be mounted on the circuit board CF in the form of an integrated chip. In addition, the circuit board CF may include an input sensing circuit for controlling the input sensor ISU.

The display panel DP is described as having a structure that includes the first pads DP-PD for mounting the driving chip DC illustrated in FIG. 1B, but embodiments described herein are not limited thereto. The driving chip DC may be mounted on the circuit board CF, and in this case, the first pads DP-PD may be omitted of the embodiments described herein.

FIG. 4 is a cross-sectional view of a display panel according to an embodiment. FIG. 5 is a cross-sectional view of an input sensor according to an embodiment.

Referring to FIG. 4, the display region DP-DA may include a light emission region PXA and a non-light emission region NPXA. Each of the pixels PX includes an organic light emitting diode OLED and a pixel driving circuit connected thereto. In detail, the pixel PX may include a first transistor TR1, a second transistor TR2, and the organic light emitting diode OLED. The transistors TR1 and TR2, which are some components of the pixel driving circuit are illustrated.

The display panel DP may include a plurality of insulating layers, a semiconductor pattern, a conductive pattern, and a signal line, etc. An insulating layer, a semiconductor layer, and a conductive layer are formed by coating, vapor deposition, or the like. Thereafter, the insulating layer, the semiconductor layer, and the conductive layer may be selectively patterned through a photolithographic process. In this way, the semiconductor pattern, the conductive pattern, and the signal line, etc., included in the circuit element layer DP-CL and the display element layer DP-OLED are formed.

The base substrate SUB may include a synthetic resin film. The base substrate SUB may have a multilayer structure. For example, the base substrate SUB may have a three-layer structure of a synthetic resin layer, an inorganic layer, and a synthetic resin layer. In particular, the synthetic resin layer may be a polyimide-based resin layer, and the material therefor is not particularly limited. In addition, the base substrate SUB may include a glass substrate, a metal substrate, or an organic/inorganic composite material substrate, or the like.

At least one inorganic layer is formed on the upper surface of the base substrate SUB. The inorganic layer may be formed as a multilayer. The inorganic layers of the multilayer may constitute a barrier layer and/or a buffer layer. In this embodiment, the display panel DP is illustrated to include the buffer layer BFL.

The semiconductor pattern is disposed on the buffer layer BFL. The semiconductor pattern may include polysilicon. However, embodiments described herein are not limited thereto, and the semiconductor pattern may include amorphous silicon or metal oxides.

FIG. 4 illustrates only some semiconductor patterns, and semiconductor patterns may be further placed in another region of the pixel PX on a plane. The semiconductor patterns may be arranged over pixels according to a specific rule. The semiconductor pattern differs in electrical properties depending on whether or not the semiconductor pattern is doped. The semiconductor pattern may include a first region and a second region. The first region may be doped with an N type dopant or a P type dopant. A P type transistor includes a doped region doped with a P type dopant.

The first region has higher conductivity than the second region and serves as an electrode or a signal line substantially. The second region may have a low doping concentration or an undoped region, and substantially corresponds to the active region (or channel) of the transistor. In other words, a portion of the semiconductor pattern may be an active transistor, another portion may be a source or drain of the transistor, and another portion may be a connection electrode or a connection signal line.

As illustrated in FIG. 4, a source S1, an active region A1, and a drain D1 of the first transistor TR1 are formed from the semiconductor pattern, and a source S2, an active region A2, and a drain D2 of the second transistor TR2 are formed from the semiconductor pattern.

FIG. 4 illustrates a portion of a connection signal line SCL formed from the semiconductor pattern. The connection signal line SCL may be electrically connected to the drain D2 of the second transistor TR2 on a plane. Another transistor may be disposed between the connection signal line SCL and the drain D2 of the second transistor TR2.

A first insulating layer 10 is disposed on the buffer layer BFL. The first insulating layer 10 overlaps the plurality of pixels PX in common and covers the semiconductor pattern. Gates G1 and G2 are disposed on the first insulating layer 10. The gates G1 and G2 may be a part of the metal pattern. The gates G1 and G2 overlap the active regions A1 and A2. In the process of doping the semiconductor pattern, the gates G1 and G2 may serve as a mask.

A second insulating layer 20 that covers the gates G1 and G2 is disposed on the first insulating layer 10. The second insulating layer 20 commonly overlaps the pixels PX. An upper electrode UE may be disposed on the second insulating layer 20. The upper electrode UE may overlap the gate G2 of the second transistor TR2. The upper electrode UE may be a part of the metal pattern. A portion of the gate G2 and the upper electrode UE overlapping the same may define a capacitor.

A third insulating layer 30 that covers the upper electrode UE is disposed on the second insulating layer 20. A first connection electrode CNE1 disposed on the third insulating layer 30 may be connected to the connection signal line SCL through a contact hole CNT-1 that penetrates the first to third insulating layers 10 to 30.

A fourth insulating layer 40 that covers the first connection electrode CNE1 is disposed on the third insulating layer 30. The first insulating layer 10 to the fourth insulating layer 40 may be an inorganic layer and/or an organic layer and may have a single-layer or multilayer structure.

A fifth insulating layer 50 is disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 that penetrates the fourth insulating layer 40 and the fifth insulating layer 50.

A sixth insulating layer 60 that covers the second connection electrode CNE2 is disposed on the fifth insulating layer 50. The sixth insulating layer 60 may be an organic layer. The first electrode AE is disposed on the sixth insulating layer 60. The first electrode AE is connected to the second connection electrode CNE2 through the contact hole CNT-3 that penetrates the sixth insulating layer 60.

An opening OP is defined in the pixel defining layer PDL. The opening OP of the pixel defining layer PDL exposes at least a portion of the first electrode AE. In this embodiment, the light emission region PXA is defined to correspond to a partial region of the first electrode AE that is exposed by the opening OP.

The hole control layer HCL may be commonly disposed in the light emitting region PXA and the non-light emission region NPXA. The hole control layer HCL may include a hole transport layer and may further include a hole injection layer. A light-emitting layer EML is disposed on the hole control layer HCL. The light-emitting layer EML may be disposed in a region corresponding to the opening OP. That is, the light-emitting layer EML may be formed separately in each of the pixels.

An electron control layer ECL is disposed on the light-emitting layer EML. The electron control layer ECL may include an electron transport layer and may further include an electron injection layer. The hole control layer HCL and the electron control layer ECL may be commonly formed in the plurality of pixels using an open mask. A second electrode CE is disposed on the electron control layer ECL. The second electrode CE has an integral shape and is commonly disposed in the plurality of pixels PX. An upper insulating layer TFL is disposed on the second electrode CE. The upper insulating layer TFL may include a plurality of thin films.

As illustrated in FIG. 5, the input sensor ISU is directly disposed on the upper insulating layer TFL. The input sensor ISU may include a first sensing insulating layer ISU-IL1, a first conductive layer ISU-CL1, a second sensing insulating layer ISU-IL2, a second conductive layer ISU-CL2, and a third sensing insulating layer ISU-IL3. The first sensing insulating layer ISU-IL1 is directly disposed on the upper insulating layer TFL. In an embodiment, the first sensing insulating layer ISU-IL1 may be omitted in some implementations.

Each of the first conductive layer ISU-CL1 and the second conductive layer ISU-CL2 may have a single-layer structure or have a multilayer structure stacked along the third direction DR3. A multi-layered conductive layer may include at least two among transparent conductive layers and metal layers. The multi-layered conductive layer may include metal layers including different metals.

The transparent conductive layer may include indium tin oxide (ITO), indium zinc oxide (IZO), zinc oxide (ZnO), indium tin zinc oxide (ITZO), PEDOT, metal nanowires, and graphene. The metal layer may include molybdenum, silver, titanium, copper, aluminum, and an alloy thereof.

For example, at least one of the first conductive layer ISU-CL1 or the second conductive layer ISU-CL2 may have a three-layer metal layer structure, for example, a three-layer structure of titanium/aluminum/titanium. A metal having relatively high durability and low reflectance may be applied to the outer layer, and a metal having high electrical conductivity may be applied to the inner layer.

Each of the first conductive layer ISU-CL1 and the second conductive layer ISU-CL2 includes a plurality of conductive patterns. Hereinafter, it will be described that the first conductive layer ISU-CL1 includes first conductive patterns and the second conductive layer ISU-CL2 includes second conductive patterns. Each of the first conductive patterns and the second conductive patterns may include sensing electrodes and signal lines connected thereto. The sensing electrodes of the first conductive patterns and the sensing electrodes of the second conductive patterns may insulate and cross each other.

In addition, according to an embodiment, the input sensor ISU may exclude any one of the first conductive layer ISU-CL1 or the second conductive layer ISU-CL2, and may include only a single conductive layer, but embodiments described herein are not limited thereto.

Each of the first sensing insulating layer ISU-IL1 to the third sensing insulating layer ISU-IL3 may include an inorganic layer or an organic layer. In this embodiment, the first sensing insulating layer ISU-IL1 and the second sensing insulating layer ISU-IL2 may be inorganic layers. The third sensing insulating layer ISU-IL3 may include an organic layer.

In addition, in the input sensor ISU, any one among the first sensing insulating layer ISU-IL1 to the third sensing insulating layer ISU-IL3 may be omitted in some implementations, and the embodiments described herein are not limited thereto.

Figure 6:
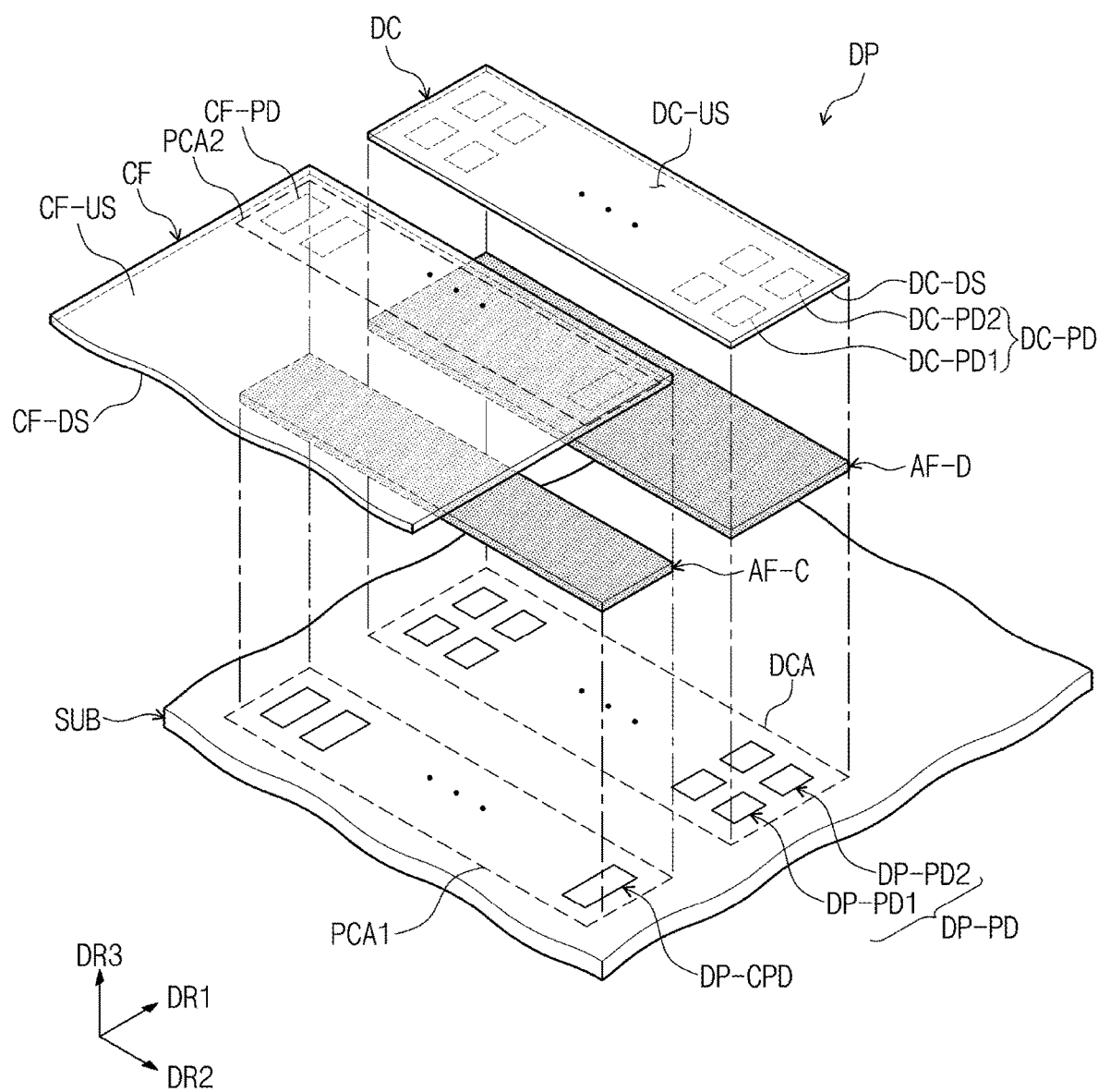
FIG. 6 is an exploded perspective view of a bonding region of an electronic device according to an embodiment.
Figure 7:
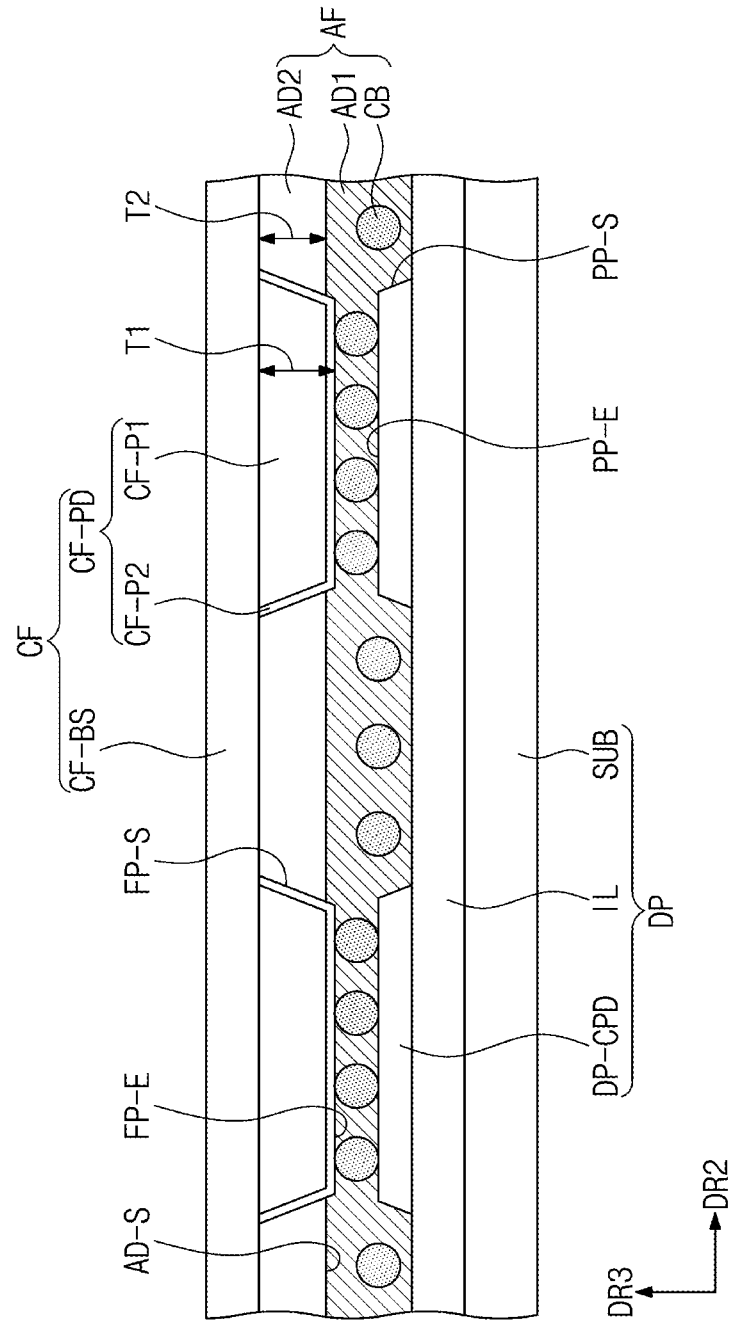
FIG. 7 is a cross-sectional view illustrating pads bonded through a conductive adhesive member according to an embodiment.

FIG. 6 is an exploded perspective view of a bonding region of an electronic device according to an embodiment. FIG. 7 is a cross-sectional view of pads bonded through a conductive adhesive member according to an embodiment.

Referring to FIG. 6, the display panel DP includes a first conductive adhesive member AF-C disposed between the circuit board CF and the base substrate SUB, and a second conductive adhesive member AF-D disposed between the driving chip DC and the base substrate SUB. The first conductive adhesive member AF-C electrically connects the circuit board CF and the display panel DP, and the second conductive adhesive member AF-D electrically connects the driving chip DC and the display panel DP.

The circuit board CF includes an upper surface CF-US and a lower surface CF-DS. The lower surface CF-DS of the circuit board CF may be a surface facing the display panel DP. The board pads CF-PD may be disposed on the lower surface CF-DS of the circuit board CF, and may be electrically connected to the second pads DP-CPD of the display panel DP, respectively. The board pads CF-PD and the second pads DP-CPD may be electrically connected to each other through the first conductive adhesive member AF-C.

The driving chip DC includes an upper surface DC-US and a lower surface DC-DS. The lower surface DC-DS of the driving chip DC may be a surface facing the display panel DP. The driving chip DC includes chip pads DC-PD electrically connected respectively to the first pads DP-PD disposed on the base substrate SUB.

The chip pads DC-PD include first row chip pads DC-PD1 arranged along the second direction DR2 and second row chip pads DC-PD2 spaced apart from the first row chip pads DC-PD1 in the first direction DR1 and arranged along the second direction DR2. The first row chip pads DC-PD1 and the second row chip pads DC-PD2 may have a shape that is exposed to the outside from the lower surface of the driving chip DC.

Although FIG. 6 illustrates that the chip pads DC-PD are arranged in two rows, the chip pads DC-PD may be arranged in a single row or a plurality of rows based on a structure in which the first pads DP-PD are arranged. The chip pads DC-PD and the first pads DP-PD may be electrically connected to each other through the second conductive adhesive member AF-D.

Referring to FIG. 7, the conductive adhesive member AF disposed between the circuit board CF and the base substrate SUB of the display panel DP is illustrated. Hereinafter, a cross-sectional view of the display panel DP and the circuit board CF connected through the conductive adhesive member AF may be applied to components connected by the first conductive adhesive member AF-C and the second conductive adhesive member AF-D described with reference to FIG. 6.

FIG. 7 illustrates that the second pads DP-CPD included in the display panel DP are disposed on the insulating layer IL. The insulating layer IL may be any one of the insulating layers 10-50 described in FIG. 4, and the second pads DP-CPD may be formed by being branched from any one of the conductive patterns disposed on the respective insulating layers 10-50, but embodiments described herein are not limited thereto.

The circuit board CF may include a base layer CF-BS and board pads CF-PD disposed on the base layer CF-BS. The board pads CF-PD include a first circuit pad CF-P1 and a second circuit pad CF-P2 that covers the first circuit pad CF-P1. The second circuit pad CF-P2 may have a smaller thickness than the first circuit pad CF-P1. In this specification, the first circuit pad CF-P1 may be made of copper, and the second circuit pad CF-P2 may be made of tin (Sn). The second circuit pad CF-P2 may prevent the first circuit pad CF-P1 made of copper from being oxidized by exposure to the outside environment.

However, embodiments described herein are not limited thereto, and the board pads CF-PD included in circuit board CF may be provided as a single layer or as three or more layers, and is not limited to any one embodiment.

The conductive adhesive member AF may include a first resin layer AD1, a second resin layer AD2, and conductive particles CB. The conductive particles CB may be disposed in the first resin layer AD1. That is, the conductive particles CB may be dispersedly disposed inside the first resin layer AD1. The board pads CF-PD and the second pads DP-CPD respectively contact the conductive particles CB, so that the board pads CF-PD and the second pads DP-CPD may be electrically connected to each other.

The first resin layer AD1 is disposed between the display panel DP and the second resin layer AD2. In this embodiment, the first resin layer AD1 may cover the upper surfaces PP-E and side surfaces PP-S of the second pads DP-CPD. In addition, the first resin layer AD1 may contact the insulating layer IL of the display panel DP.

The second resin layer AD2 may be disposed between the first resin layer AD1 and the circuit board CF. The second resin layer AD2 may cover the side surfaces FP-S of the board pads CF-PD.

Since the board pads CF-PD penetrate the second resin layer AD2 in a bonded state, a connection surface FP-E of each of the board pads CF-PD may be exposed from the second resin layer AD2 and contact the conductive particles CB. Accordingly, each of the board pads CF-PD may have a first thickness T1 in the third direction DR3, and the second resin layer AD2 may have a second thickness T2 smaller than the first thickness T1.

The conductive adhesive member AF includes the second resin layer AD2 having the second thickness T2 smaller than the first thickness T1 of the board pads CF-PD, so that the board pads CF-PD may be easily connected to the conductive particles CB during a press-bonding process. Accordingly, the conductive adhesive member AF having improved electrical connection characteristics may be provided.

In general, the conductive particles CB are disposed between the pads to electrically connect the pads. Electrical connection may be performed through a process of pressing the upper or lower surface of the conductive adhesive member AF. In this case, the arrangement of the conductive particles CB included in the resin layer may also be changed in the resin layer due to the pressure applied to the resin layer. Accordingly, the conductive particles CB disposed between the two adjacent pads may move close to each other, and in this case, a short-circuit may be induced between the two pads receiving different signals.

The first resin layer AD1 and the second resin layer AD2 that are used in embodiments described herein may be an adhesive resin including different initiators. For example, the first resin layer AD1 may include a photocuring agent, and the second resin layer AD2 may include a thermosetting agent. The first resin layer AD1 including a photoinitiator may be activated by ultraviolet light UV, and the second resin layer AD2 including a thermal initiator may be activated by external heat.

The first resin layer AD1 including the photocuring agent may be pre-cured (first curing) by UV before the pads are press-bonded. In this case, as the first resin layer AD1 is photocured, the conductive particles CB disposed in the first resin layer AD1 may be arranged inside the first resin so as to have a predetermined arrangement state.

Thereafter, the second resin layer AD2 having a thermosetting agent is pressed through a heating bar to proceed main curing (second curing). In this case, even when a predetermined pressure is applied to the resin layers AD1 and AD2, the fluidity of the conductive particles CB included in the photocured first resin layer AD1 decreases in the first resin layer AD1, thereby connecting the board pads CF-PD and the second pads DP-CPD while maintaining the initial arrangement.

As a result, it is possible to prevent a short-circuit from occurring between two is board pads or two second pads that receive different signals. Accordingly, even if the pitch between adjacent pads is reduced, the pads may be easily coupled through the conductive adhesive member AF used in the embodiments described herein. Accordingly, an electronic device ED having improved electrical connection characteristics may be provided.

Figure 8:
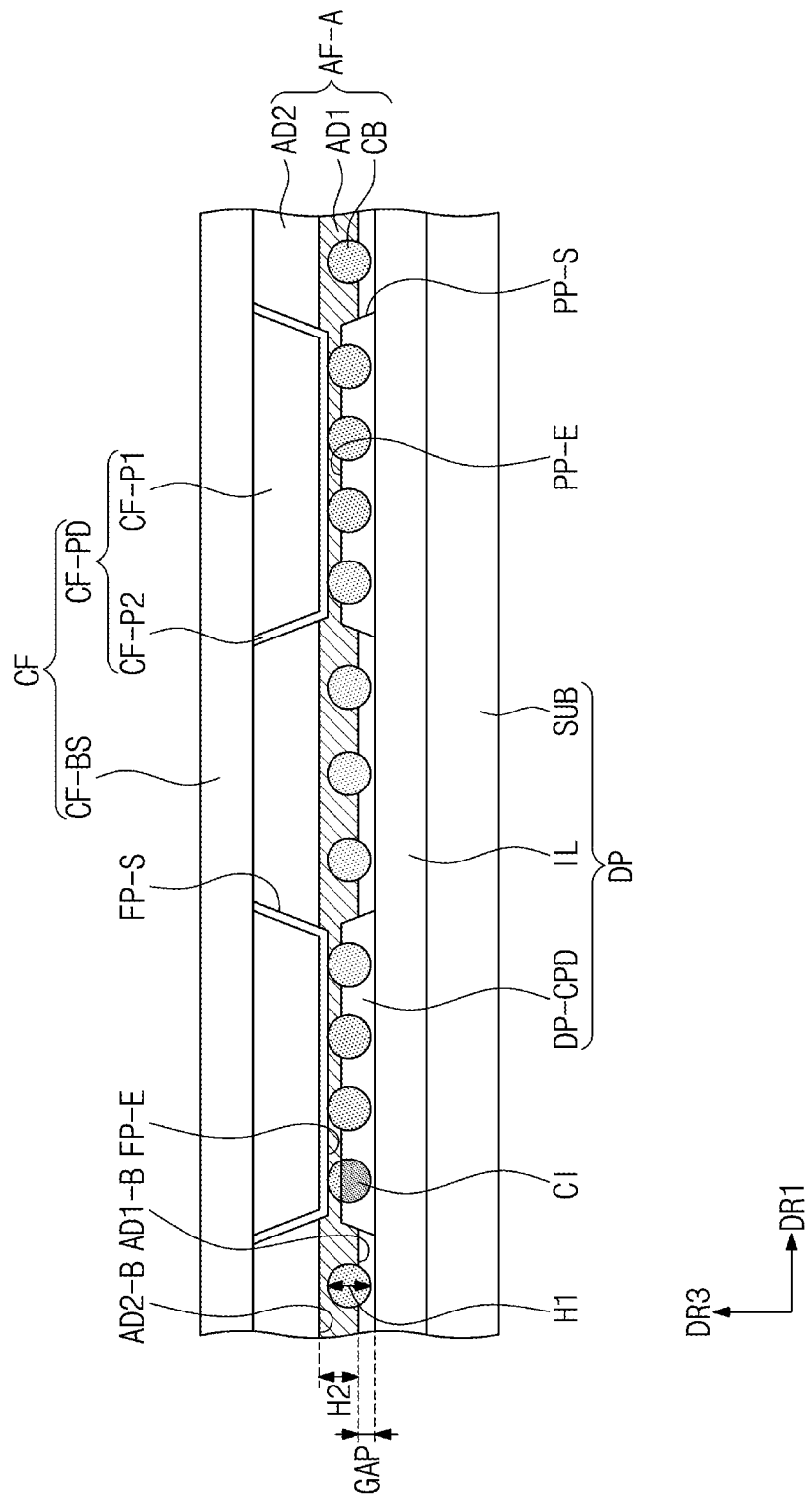
FIG. 8 is a cross-sectional view illustrating pads bonded through a conductive adhesive member according to an embodiment.
Figure 9:
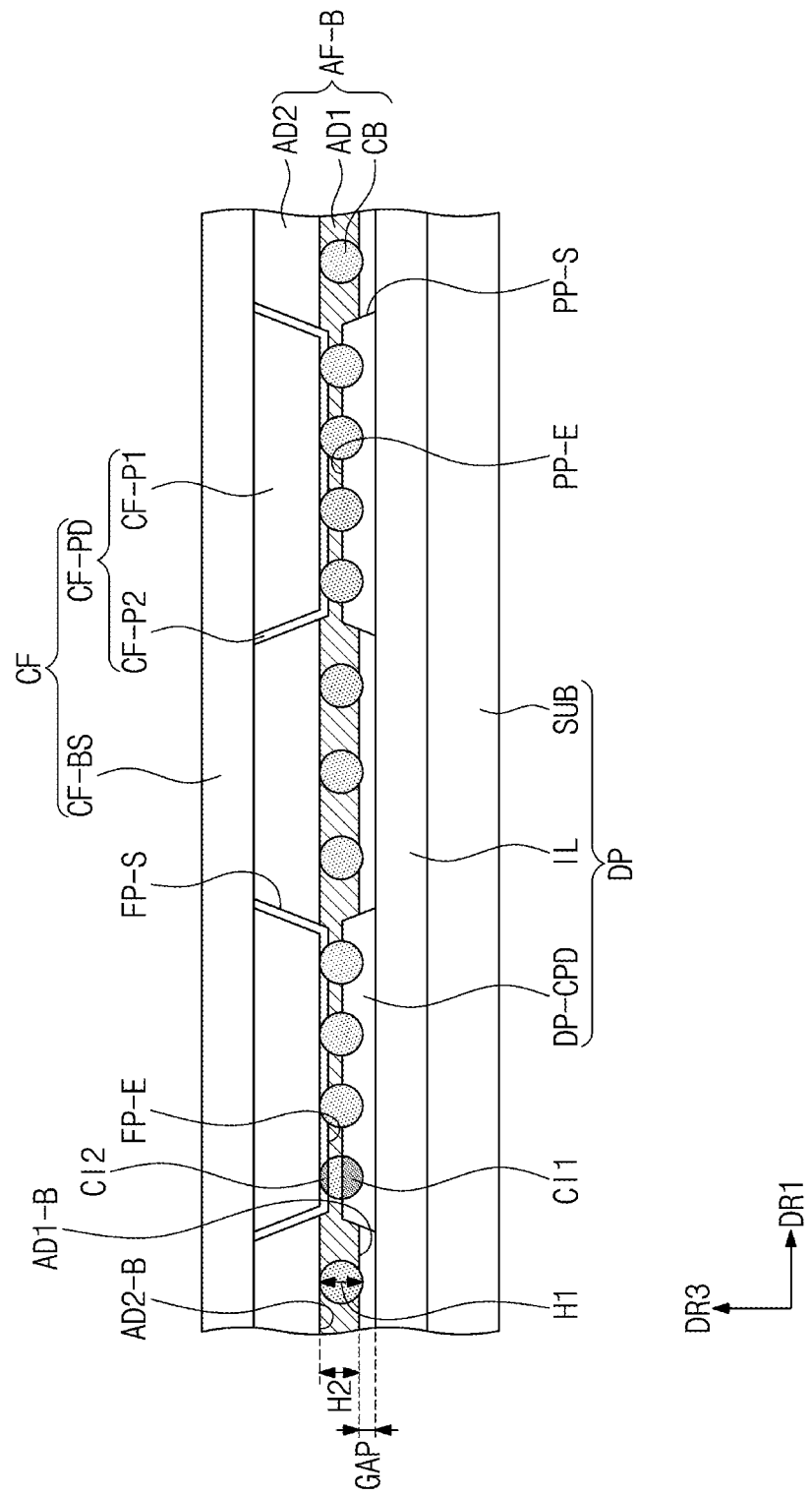
FIG. 9 is a cross-sectional view illustrating pads bonded through a conductive adhesive member according to an embodiment.

FIG. 8 is a cross-sectional view illustrating pads bonded through a conductive adhesive member according to an embodiment. FIG. 9 is a cross-sectional view illustrating pads bonded through a conductive adhesive member according to an embodiment.

The same/similar reference numerals or symbols are used for the same/similar components as those described in FIG. 7, and duplicate descriptions thereof are omitted for ease in explanation of this figure. The circuit board CF and the display panel DP described with reference to FIG. 7 may be applied in the same manner as the circuit board CF and the display panel DP to be described with reference to FIGS. 8 and 9, and duplicate descriptions thereof are omitted for ease in explanation of these figures.

Referring to FIG. 8, a conductive adhesive member AF-A that is used in embodiments described herein may include the first resin layer AD1 including the photoinitiator and the second resin layer AD2 including the thermal initiator. The conductive particles CB may be disposed in the first resin layer AD1.

In this embodiment, the conductive particles CB may have a minimum diameter H1, and the first resin layer AD1 may have a maximum thickness H2. The minimum diameter H1 of the conductive particles CB may be greater than the maximum thickness H2 of the first resin layer AD1. Accordingly, a portion of the conductive particles CB may protrude from one surface AD1-B of the first resin layer AD1.

According to this embodiment, the first resin layer AD1 including the photoinitiator is pre-cured by photocuring before the press-bonding process proceeds. Even if the fluidity of the conductive particles CB disposed in the first resin layer AD1 is reduced in the first resin layer AD1, a portion of the conductive particles CB protrude from one surface AD1-B of the first resin layer AD1, so that the conductive adhesive member AF-A may easily connect the second pads DP-CPD to the board pads CF-PD.

A portion CI of the conductive particles overlapping the second pads DP-CPD among the conductive particles CB may be inserted into the second pads DP-CPD due to the press-bonding process. Accordingly, the conductive particles DB may be stably connected to the second pads DP-CPD.

According to this embodiment, the maximum thickness H2 of the first resin layer AD1 is smaller than the minimum diameter H1 of the conductive particles CB. Accordingly, during the press-bonding process, a predetermined gap GAP may be formed between the first resin layer AD1 and the display panel DP, more particularly, between one surface AD1-B of the first resin layer AD1 where some of the conductive particles CB are exposed and the insulating layer IL. Accordingly, at least a portion of the side surfaces PP-S of the second pads DP-CPD may be exposed from the first resin layer AD1.

FIG. 8 illustrates that the gap GAP is formed over the entire region, but the embodiments described herein are not limited thereto. Depending on the environment of the pressing process, a portion, in which the insulating layer IL and the first resin layer AD1 are in contact with each other, may be formed in one region, and a region, in which the predetermined gap GAP is formed, may be provided in another region, but is not limited to any one embodiment.

Referring to FIG. 9, the conductive adhesive member AF-A that is used in embodiments described herein may include the first resin layer AD1 including the photocuring agent and the second resin layer AD2 including the thermosetting agent. The conductive particles CB may be disposed in the first resin layer AD1.

In this embodiment, the conductive particles CB may have the minimum diameter H1, and the first resin layer AD1 may have the maximum thickness H2. The minimum diameter H1 of the conductive particles CB may be greater than the maximum thickness H2 of the first resin layer AD1. Accordingly, a portion of the conductive particles CB may protrude from one surface AD1-B of the first resin layer AD1.

According to this embodiment, a first portion CI1 of the conductive particles, overlapping the second pads DP-CPD and the board pads CF-PD, among the conductive particles CB is inserted into the second pads DP-CPD, and the second portion CI2 may be inserted into the board pads CF-PD. Accordingly, the conductive particles CB may stably connect the second pads DP-CPD and the board pads CF-PD.

According to this embodiment, the maximum thickness H2 of the first resin layer AD1 is smaller than the minimum diameter H1 of the conductive particles CB. Accordingly, during the press-bonding process, the predetermined gap GAP may be formed between the first resin layer AD1 and the display panel DP, more particularly, between one surface AD1-B of the first resin layer AD1 where some of the conductive particles CB are exposed and the insulating layer IL.

FIGS. 10A to 10E are cross-sectional views illustrating a method of manufacturing an electronic device according to an embodiment. The same/similar reference numerals or symbols are used for the same/similar components as those described in FIG. 7, and duplicate descriptions thereof are omitted for ease in explanation of these figures.

Figure 10A:
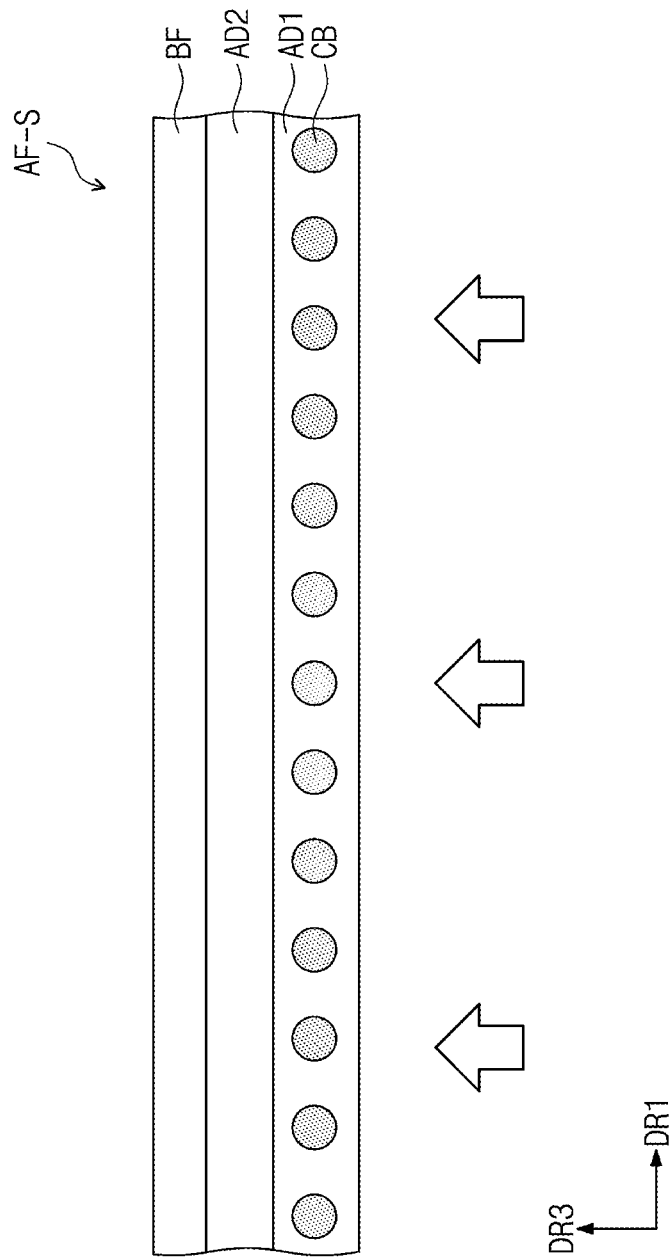
FIGS. 10A, 10B, 10C, 10D, and 10E are cross-sectional views illustrating a method of manufacturing an electronic device according to an embodiment.

Referring to FIG. 10A, a method for manufacturing an electronic device according to an embodiment includes providing a preliminary conductive adhesive member AF-S.

The preliminary conductive adhesive member AF-S may include a cover film BF, the first resin layer AD1, the second resin layer AD2, and the conductive particles CB. The conductive particles CB may be disposed in the first resin layer AD1. The first resin layer AD1 may include a photoinitiator, and the second resin layer AD2 may include a thermal initiator.

Thereafter, the method for manufacturing an electronic device may include performing first curing on the first resin layer AD1 of the preliminary conductive adhesive member AF-S. In the first curing, the first resin layer AD1 including the photoinitiator may be cured by being activated by ultraviolet light UV. As the first resin layer AD1 is cured, the conductive particles CB may be disposed in a predetermined arrangement in the first resin layer AD1. The fluidity of the conductive particles CB in the first resin layer AD1 after the first curing may become lower than the fluidity of the conductive particles in the first resin layer AD1 before the first curing.

Figure 10B:
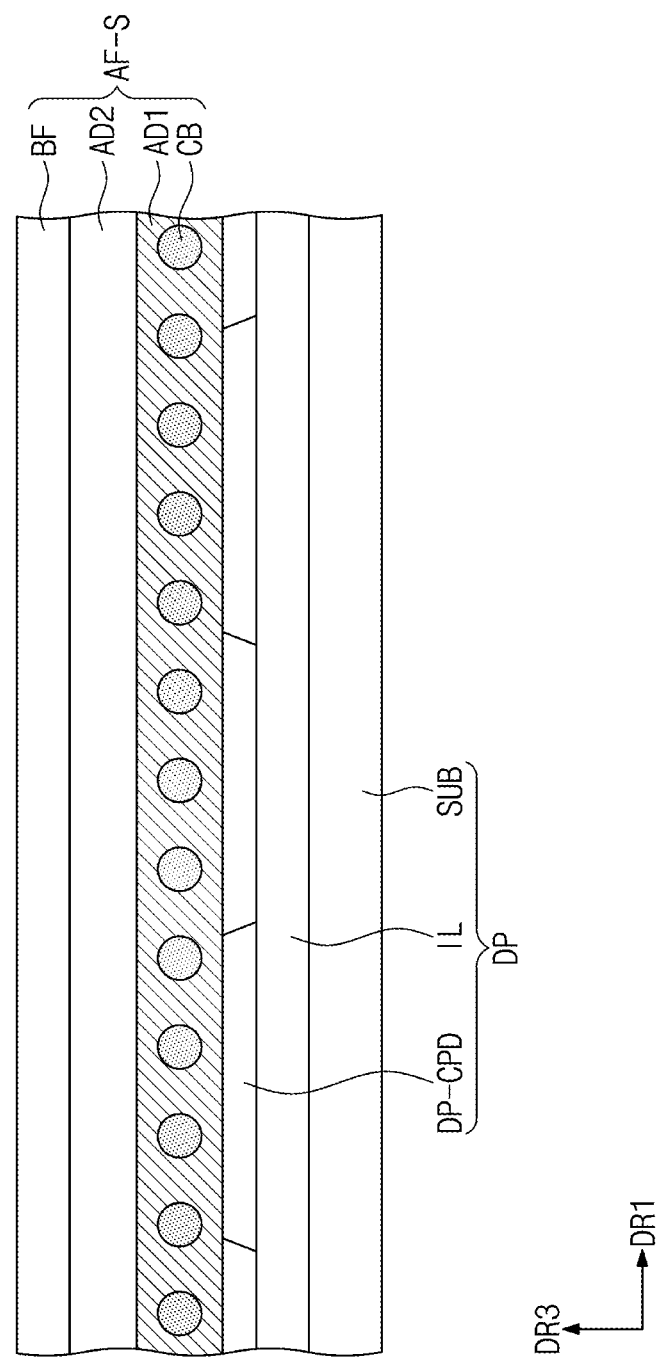
Figure 10C:
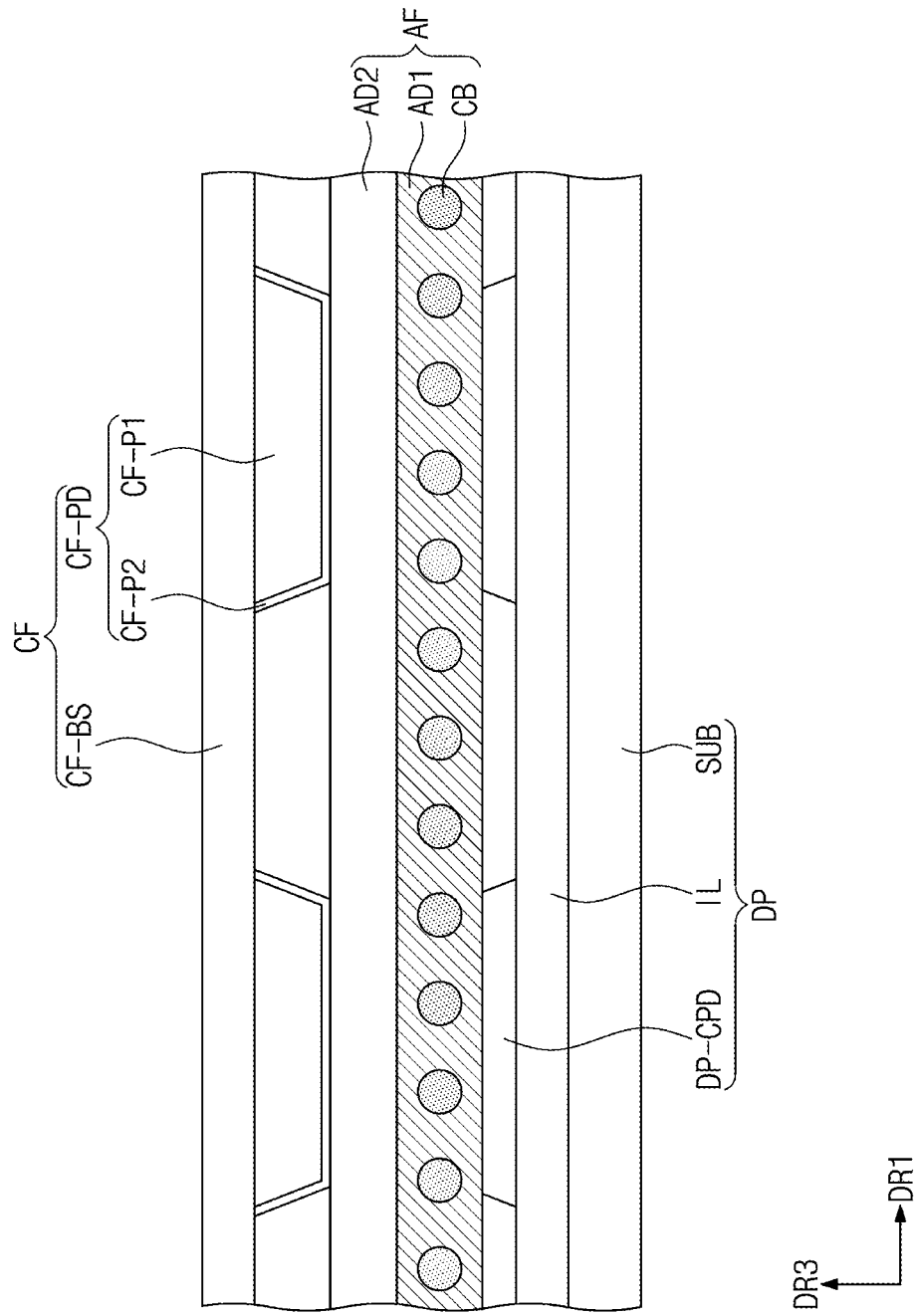

Thereafter, referring to FIGS. 10B and 10C, the method of manufacturing the electronic device according to an embodiment may include providing the preliminary conductive adhesive member AF-S on the pads DP-CPD (the second pads DP-CDP of FIG. 3) of the display panel DP. The display panel DP may include the base substrate SUB, the insulating layer IL, and the pads DP-CPD.

Thereafter, the method may include removing the cover film BF from the preliminary conductive adhesive member AF-S. The cover film BF may be provided in the form of a release film.

Thereafter, the method may include aligning the board pads CF-PD included in the circuit board CF with the pads DP-CPD included in the display panel DP. Before the press-bonding, the board pads CF-PD may be disposed on the second resin layer AD2.

Figure 10D:
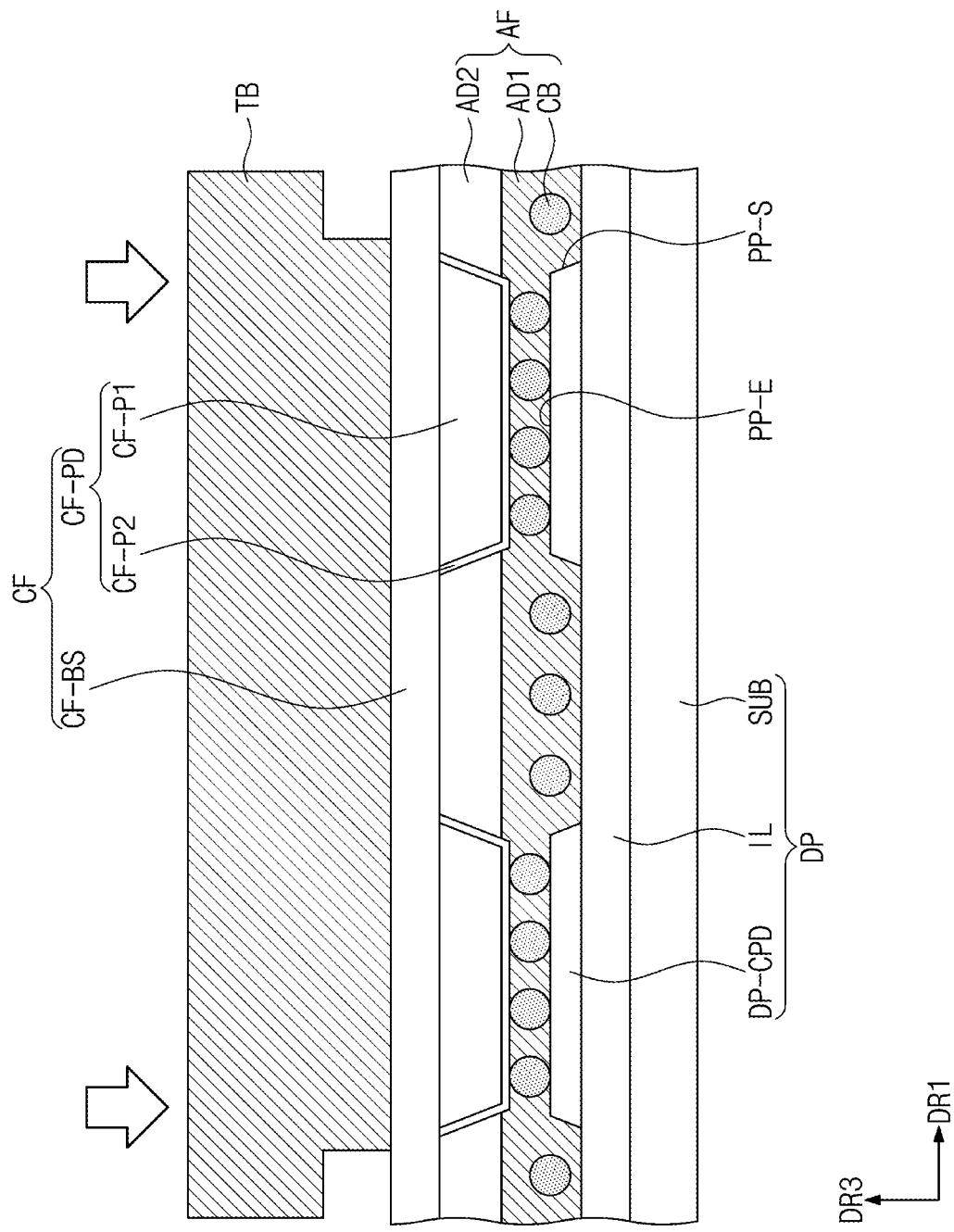
Figure 10E:
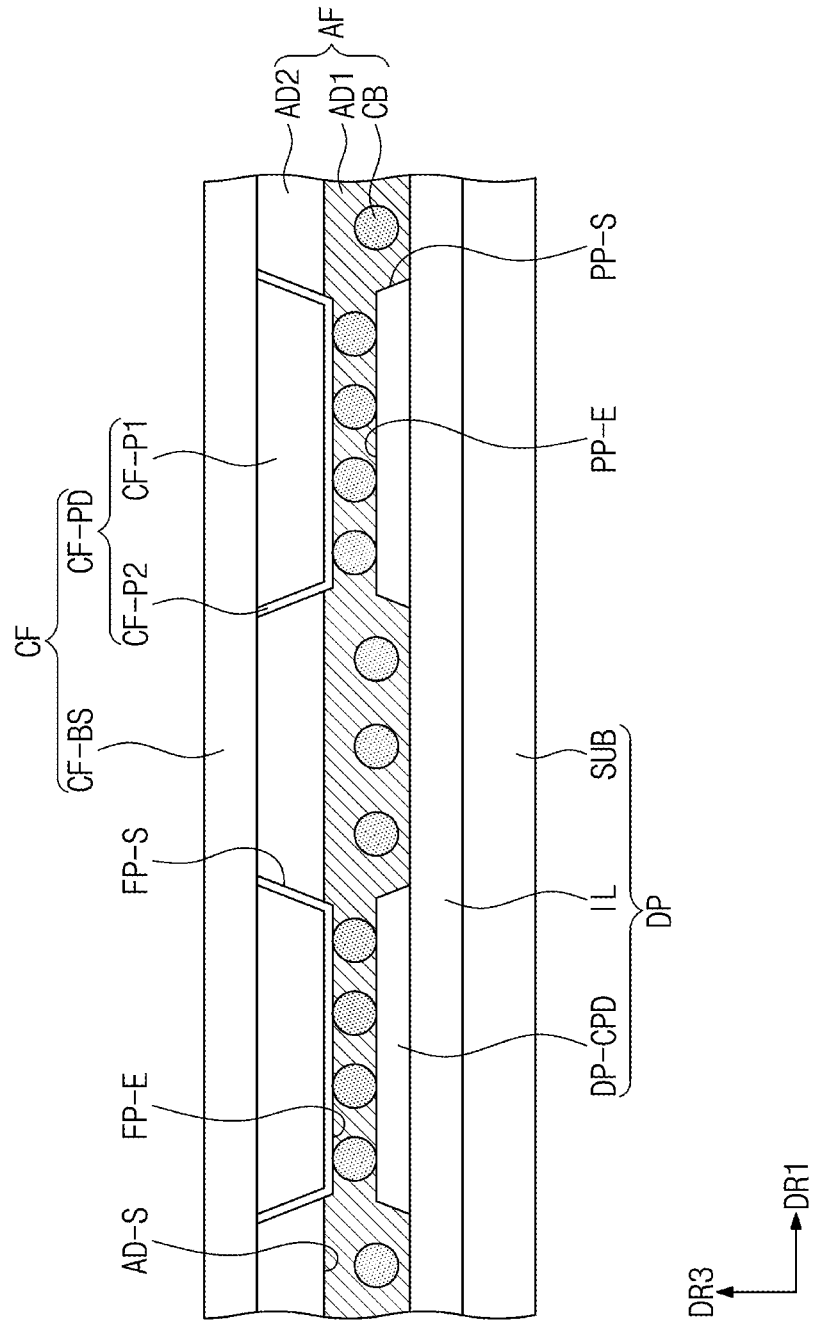

Thereafter, referring to FIG. 10D, the method of manufacturing the electronic device according to the embodiments described herein may include performing second curing on the second resin layer AD2 by pressing the circuit board CF through a heating bar TB. Since the second resin layer AD2 includes the thermal initiator and pressing is performed with the heating bar TB having a predetermined temperature, the second resin layer AD2 may be activated and cured by heat while the board pads CF-PD penetrate the second resin layer AD2 and contacts the conductive particles CB.

Thereafter, referring to 10E, according to the method of manufacturing the display device according to an embodiment, the first curing is performed on the first resin layer AD1 in which the conductive particles CB are disposed and that includes the photoinitiator, and then the second curing is performed using the heating bar TB. Therefore, even when a predetermined pressure is applied to the resin layers AD1 and AD2, the fluidity of the conductive particles CB included in the photocured first resin layer AD1 is reduced in the first resin layer AD1, thereby connecting the conductive particles CB the board pads CF-PD to the pads DP-CPD while maintaining initial arrangement.

As a result, it is possible to prevent a short-circuit from occurring between two board pads or two second pads that receive different signals. Accordingly, even if the pitch between adjacent pads is reduced, the pads may be easily coupled through the conductive adhesive member AF used in the embodiments described herein. Accordingly, an electronic device ED having improved electrical connection characteristics may be provided.

According to embodiments, the resin layer including the photocuring agent is pre-cured, and then the resin layer including the thermosetting agent is mainly cured, thereby making it possible to prevent a short-circuit between the two pads receiving different signals.

Accordingly, even if the pitch between adjacent pads is reduced, the pads may be easily coupled through the conductive adhesive member of the embodiments described above. Accordingly, it is possible to provide an electronic device having improved electrical connection characteristics.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. An electronic device comprising:
a display panel that includes a plurality of first pads;
a circuit board that includes a plurality of second pads corresponding to the plurality of first pads; and
a conductive adhesive member disposed between the display panel and the circuit board to connect the plurality of first pads and the plurality of second pads, and in which the conductive adhesive member includes a first resin layer adjacent to the display panel, a second resin layer disposed between the first resin layer and the circuit board and having a curing agent different from that of the first resin layer, and conductive particles disposed in the first resin layer, and wherein at least one of the plurality of second pads protrudes through the second resin layer and is in contact with the conductive particles.

2. The electronic device of claim 1, wherein the first resin layer comprises a photocuring agent and the second resin layer comprises a thermosetting agent.

3. The electronic device of claim 1, wherein a minimum diameter of the conductive particles is greater than a thickness of the first resin layer.

4. The electronic device of claim 3, wherein at least a portion of the conductive particles is disposed inside the plurality of first pads.

5. The electronic device of claim 4, wherein at least another portion of the conductive particles is disposed inside the plurality of second pads.

6. The electronic device of claim 3, wherein at least one of the conductive particles does not overlap the plurality of first pads and protrudes from a surface of the first resin layer adjacent to the display panel.

7. The electronic device of claim 3, wherein a gap is formed between the first resin layer and the display panel, and at least a portion of side surfaces of the first pads is exposed from the first resin layer.

8. The electronic device of claim 1, wherein a maximum thickness of the second resin layer is smaller than a thickness of the plurality of second pads.

9. The electronic device of claim 1, wherein
the display panel comprises pixels and a driving chip,
the plurality of first pads include a plurality of first sub pads arranged in a first direction, and a plurality of second sub pads spaced apart from the plurality of first sub pads,
the driving chip is connected to the plurality of first sub pads, and
the circuit board is connected to the plurality of second sub pads.

10. The electronic device of claim 9, wherein the plurality of first sub pads comprise:
a plurality of first row pads arranged in the first direction; and
a plurality of second row pads spaced apart from the plurality of first row pads in a second direction intersecting the first direction, and arranged along the first direction.

11. The electronic device of claim 1, wherein the first resin layer is in contact with the display panel.

12. An electronic device comprising:
a display panel including a plurality of first pads;
a circuit board including a plurality of second pads corresponding to the plurality of first pads; and
a conductive adhesive member disposed between the display panel and the circuit board to connect the plurality of first pads and the plurality of second pads, and the conductive adhesive member including a first resin layer having a photocuring agent, a second resin layer disposed between the first resin layer and the circuit board and including a thermosetting agent, and conductive particles disposed in the first resin layer, and
wherein a minimum diameter of the conductive particles is greater than a thickness of the first resin layer.

13. The electronic device of claim 12, wherein at least one of the plurality of second pads protrudes through the second resin layer and is in contact with the conductive particles.

14. The electronic device of claim 13, wherein a maximum thickness of the second resin layer is smaller than a thickness of the plurality of second pads.

15. The electronic device of claim 12, wherein at least a portion of the conductive particles is disposed inside the plurality of first pads.

16. The electronic device of claim 15, wherein at least another portion of the conductive particles is disposed inside the plurality of second pads.

17. The electronic device of claim 12, wherein at least one of the conductive particles does not overlap the plurality of first pads and protrudes from a surface of the first resin layer adjacent to the display panel.

18. The electronic device of claim 12, wherein a gap is formed between the first resin layer and the display panel, and at least a portion of side surfaces of the first pads is exposed from the first resin layer.

19. A method of manufacturing an electronic device, the method comprising:
providing a preliminary conductive adhesive member including a cover film, a first resin layer, conductive particles disposed in the first resin layer, and a second resin layer disposed between the cover film and the first resin layer;
performing first curing on the first resin layer;
providing the preliminary conductive adhesive member on a plurality of pads included in a display panel;
removing the cover film from the preliminary conductive adhesive member;
aligning pads included in a circuit board with the plurality of pads of the display panel; and
performing second curing on the second resin layer by pressing the circuit board through a heating bar.

20. The method of claim 19, wherein the first resin layer comprises a photocuring agent and the second resin layer comprises a thermosetting agent.

* * * * *